(12) United States Patent
Pontarollo

(10) Patent No.: US 6,249,161 B1
(45) Date of Patent: Jun. 19, 2001

(54) METHOD AND DEVICE FOR GENERATING A PULSE SIGNAL WITH MODULABLE-WIDTH PULSES

(75) Inventor: Serge Pontarollo, Saint Martin le Vinous (FR)

(73) Assignee: STMicroelectronics, S.A., Gentilly (FR)

(*) Notice: Subject to any disclaimer, the term of this patent is extended or adjusted under 35 U.S.C. 154(b) by 0 days.

(21) Appl. No.: 09/526,967

(22) Filed: Mar. 16, 2000

(30) Foreign Application Priority Data

Mar. 16, 1999 (FR) .................................................. 99 03239

(51) Int. Cl.⁷ .................................................. H03K 3/017
(52) U.S. Cl. .......................... 327/172; 327/175; 332/110
(58) Field of Search ..................... 327/172–176; 332/109, 110; 375/238

(56) References Cited

U.S. PATENT DOCUMENTS

| | | | |
|---|---|---|---|
| 5,361,048 | * 11/1994 | Baum et al. | 332/109 |
| 5,455,530 | * 10/1995 | Huppenthal | 327/175 |
| 6,084,451 | * 7/2000 | Choi et al. | 327/175 |

FOREIGN PATENT DOCUMENTS

| | | |
|---|---|---|
| 28 45 598 | 4/1979 | (DE) . |
| 2845598A1 | * 9/1992 | (DE) . |
| 503571A1 | * 9/1992 | (EP) . |
| 0 503 571 | 9/1992 | (EP) . |

* cited by examiner

*Primary Examiner*—Kenneth B. Wells
(74) *Attorney, Agent, or Firm*—Theodore E. Galanthay; Stephen C. Bongini; Fleit, Kain, Gibbons, Gutman & Bongini P.L.

(57) ABSTRACT

A method is provided for generating a pulse signal with modulable-width pulses. A set-point signal is generated and compared with a control signal so as to produce the pulse signal. When the control signal is a two-state logical signal, a first reference voltage is taken as the set-point signal. When the control signal is a continuous analog voltage, the set-point signal is varied between the first reference voltage and a predetermined second reference voltage, which is higher than the first reference voltage. Also provided is a device for generating a pulse signal with modulable-width pulses. The device includes a set-point signal generator, a control signal generator, and a comparator that outputs the pulse signal. The set-point signal generator includes a first voltage source for generating a first reference voltage, and a second voltage source for generating a second reference voltage, which is higher than the first reference voltage. In a first operating state, the generated set-point signal varies between the two reference voltages, and in a second operating state, the first reference voltage is supplied as the set-point signal. The set-point signal generator is operated in the first operating state when the control signal generator generates a continuous analog voltage as the control signal, and in the second operating state when the control signal generator generates a two-state logical signal as the control signal.

22 Claims, 4 Drawing Sheets

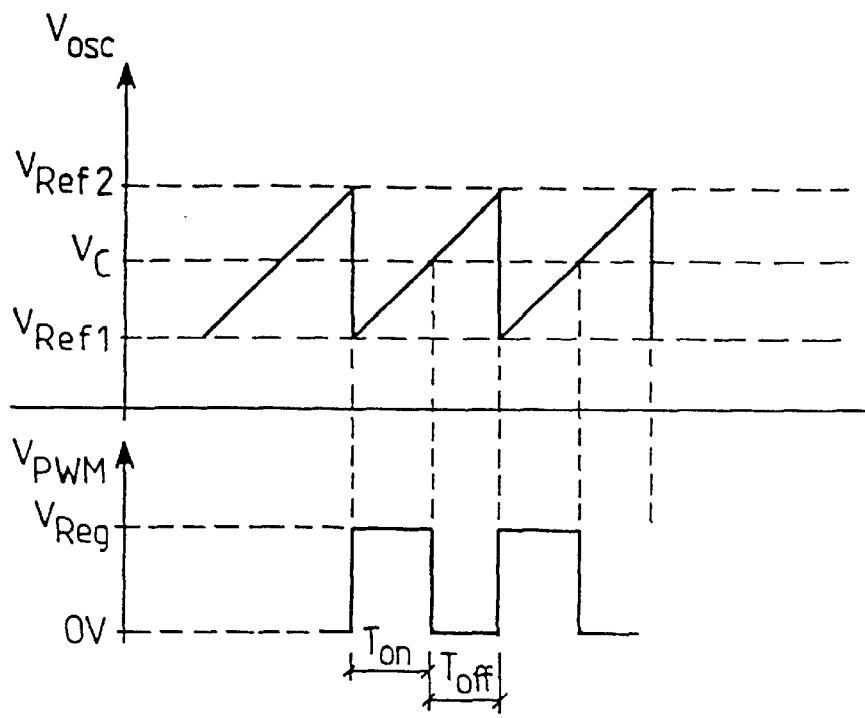
FIG. 2a
FIG. 2b
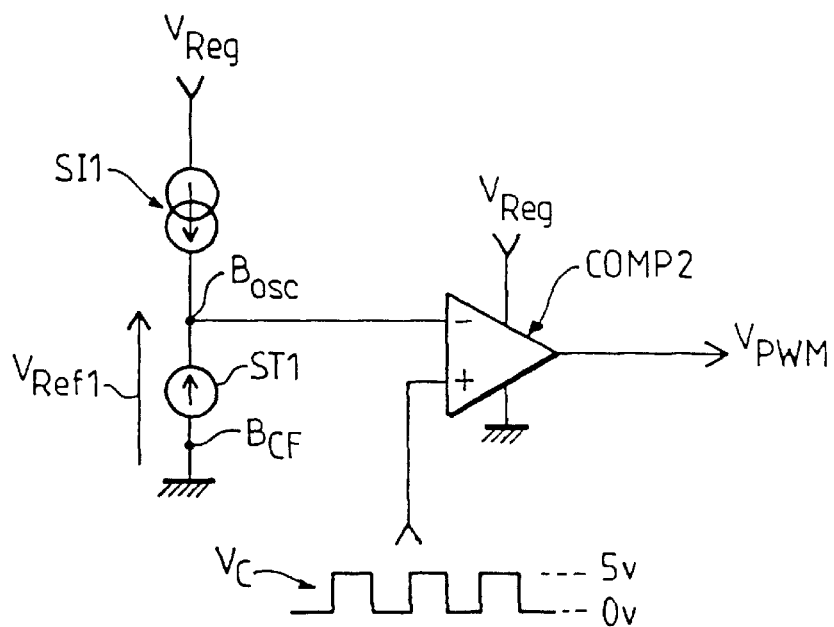
FIG. 3

METHOD AND DEVICE FOR GENERATING A PULSE SIGNAL WITH MODULABLE-WIDTH PULSES

CROSS-REFERENCE TO RELATED APPLICATIONS

This application is based upon and claims priority from prior French Patent Application No. 99-03239, filed Mar. 16, 1999, the entire disclosure of which is herein incorporated by reference.

BACKGROUND OF THE INVENTION

1. Field of the Invention

The present invention relates to electronic circuits, and more specifically to methods and devices for generating a pulse signal with modulable-width pulses.

2. Description of Related Art

Pulse width modulation (PWM) signals, which are pulse signals with modulable-width pulses, have many applications. For example, such signals are used to drive power transistors that control the current flowing through an electric motor, such as those used in the automobile industry for controlling electric windows, sunroofs, and windscreen wipers. Conventionally, a set-point signal (generally with a "sawtooth" form) is generated using an oscillator, and is compared with a control voltage by a comparator. The output of the comparator then delivers the pulse signal, whose duty cycle is determined by the value of the control voltage.

In certain applications, either a continuous analog voltage or a logical signal with two states (0 or 1) can be used as the control signal (for example, to produce a pulse control signal whose two levels are 0 and 5 volts). In other words, it may be necessary to carry out "analog" PWM control or "logical" PWM control in certain applications. Although conventional circuits for generating PWM pulse signals operate correctly when the control signal is a continuous analog voltage, such conventional circuits have operating problems when a logical signal is supplied to the input of the comparator as the control signal. In particular, problems are caused by instabilities in the PWM signal when the two inputs of the comparator are equal (for example, both at 0 volts).

SUMMARY OF THE INVENTION

In view of these drawbacks, it is an object of the present invention to overcome the above-mentioned drawbacks and to allow logical or analog PWM control using the same electronic circuit.

Another object of the present invention is to allow a PWM pulse signal whose duty cycle is independent of temperature to be generated.

One embodiment of the present invention provides a method for generating a pulse signal with modulable-width pulses. According to the method, a set-point signal is generated, and the set-point signal is compared with a control signal so as to produce the pulse signal. When the control signal is a two-state logical signal, a first reference voltage is taken as the set-point signal. When the control signal is a continuous analog voltage, the set-point signal is varied between the first reference voltage and a predetermined second reference voltage, which is higher than the first reference voltage. In a preferred method, the difference in level between the first reference voltage and the logical signal is greater than the offset voltage of a comparator that performs the comparison.

Another embodiment of the present invention provides a device for generating a pulse signal with modulable-width pulses. The device includes a set-point signal generator for generating a set-point signal, a control signal generator for generating a control signal, and a comparator that receives the set-point signal and the control signal. The comparator outputs the pulse signal. Further, the set-point signal generator includes a first voltage source for generating a first reference voltage, and a second voltage source for generating a second reference voltage, which is higher than the first reference voltage. In a first operating state, the generated set-point signal varies between the two reference voltages, and in a second operating state, the first reference voltage is supplied as the set-point signal. Additionally, the control signal generator can generate both a continuous analog voltage and a two-state logical signal. The set-point signal generator is operated in the first operating state when the control signal generator generates the continuous analog voltage as the control signal, and in the second operating state when the control signal generator generates the logical signal as the control signal. In one preferred embodiment, the device also includes a capacitor having a terminal that is coupled to ground, with the first voltage source being coupled between the first input of the comparator and another terminal of the capacitor; and short-circuit means for selectively grounding the first terminal of the capacitor.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 2a and 2b are timing diagrams illustrating the operation of the device of FIG. 1;

FIG. 3 is a schematic diagram illustrating the device of FIG. 1 in a configuration suitable for a logical control mode;

DETAILED DESCRIPTION OF PREFERRED EMBODIMENTS

Figure 1:
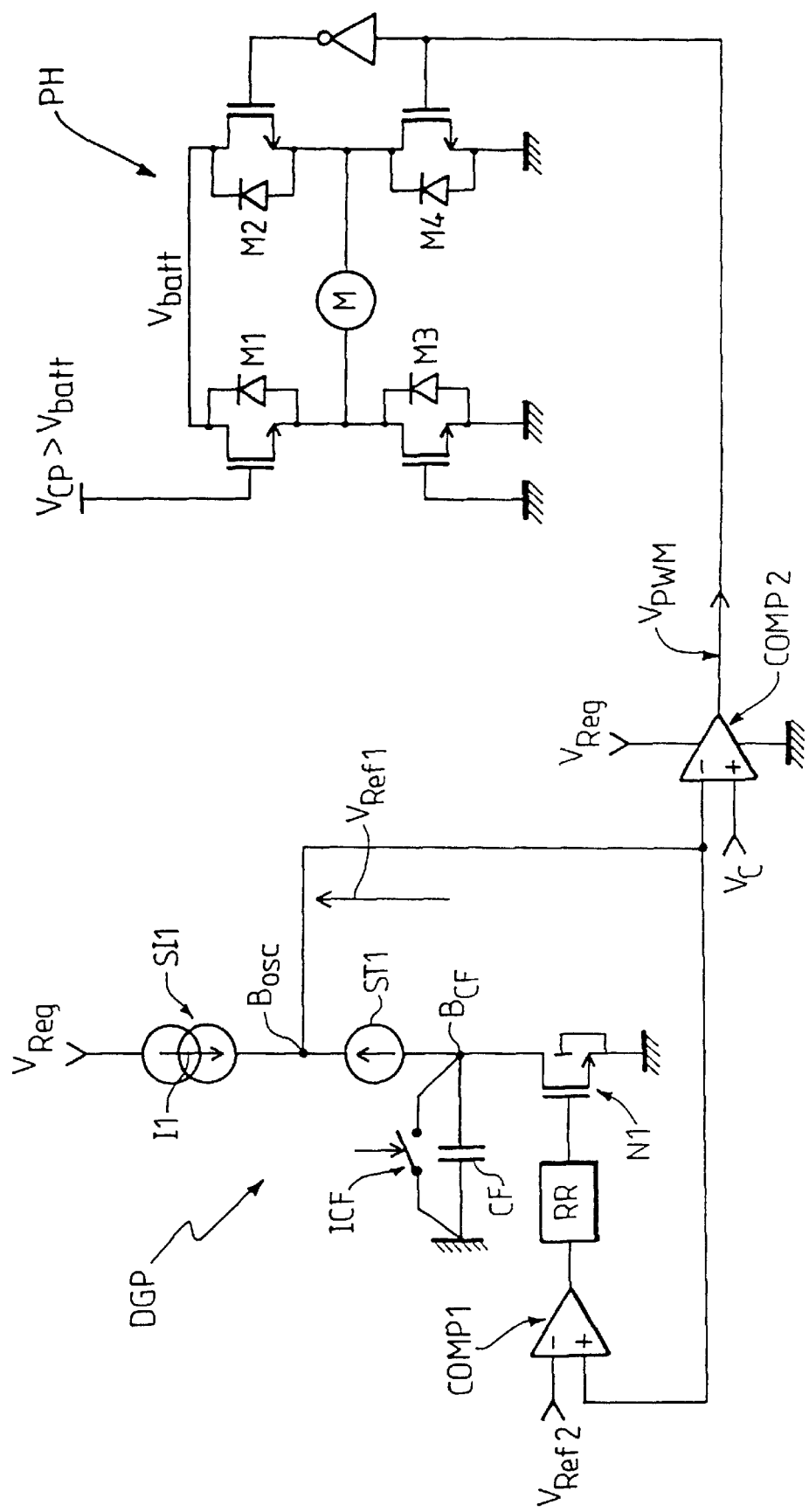
FIG. 1 is a schematic diagram illustrating, in a configuration suitable for an analog control mode, a device for generating a pulse signal according to a preferred embodiment of the present invention.

Preferred embodiments of the present invention will be described in detail hereinbelow with reference to the attached drawings.

Preferred embodiments of the present invention provide methods for generating a pulse signal with modulable-width pulses by generating a set-point signal and comparing it with a control signal in order to obtain the pulse signal. When the control signal is a two-state logical signal, the control signal is compared with a first reference voltage that is taken as the set-point signal. The difference in level between the first reference voltage and the logical control signal is greater than the offset voltage of the comparator making the comparison. When the control signal is a continuous analog voltage, the set-point signal is varied between the first reference voltage and a predetermined second reference voltage, which is higher than the first reference voltage.

The use of two reference voltages makes it possible to avoid the risk of undefined states when a logical control mode is being used, while also permitting correct operation in an analog control mode. In one preferred method, when the control signal is a continuous analog voltage, the first reference voltage is generated in floating mode by connecting a first voltage source between a first input of the comparator and a grounded capacitor. When the control signal is a two-state logical signal, the terminal of the first voltage source that is connected to the capacitor is grounded. In other words, the capacitor is short-circuited.

Further embodiments of the present invention provide a device for generating a pulse signal with modulable-width pulses. The device includes a first generator for generating a set-point signal, a second generator for generating a control signal, and a comparator that receives the set-point signal and the control signal and outputs the pulse signal. The first generator includes a first voltage source that generates a first reference voltage, a second voltage source that generates a second reference voltage, which is higher than the first, and a processing circuit having a first operating state in which a set-point signal varying between the two reference voltages is created from the two reference voltages, and a second operating state in which the first reference voltage is supplied as the set-point signal to the first input of the comparator. The second generator generates a continuous analog voltage or a two-state logical signal, with the difference in level between the first reference voltage and the logical signal being greater than the offset voltage of the comparator.

Furthermore, the first generator includes a control circuit for putting the processing circuit in its first operating state when the second generator delivers the continuous analog voltage as the control signal, and in its second operating state when the second generator delivers the logical signal as the control signal. Thus, the device of the present invention functions properly irrespective of whether the logical or analog control mode is used to generate the PWM pulse signal. In one embodiment, the first voltage source is connected between the first input of the comparator and a first terminal of the capacitor, the other terminal of which is grounded. The control circuit includes short-circuit means that can ground the first terminal of the capacitor.

When the control mode is analog, the duty cycle and the period of the pulse signal depend on the difference between the second voltage source and the first voltage source. Therefore, it is preferable for this voltage difference to be independent of variations in temperature. For this purpose, in one embodiment of the present invention, the first reference voltage and the second reference voltage are produced such that they are both independent of temperature. Furthermore, so that the difference between these two voltages is insensitive to variations in the fabrication process, it is preferable to produce the two voltage sources simultaneously on the integrated circuit and to match them rigorously (i.e., to produce them beside one another on the integrated circuit with the same structural characteristics).

According to one embodiment, a first reference voltage equal to the sum of an emitter-collector voltage difference ($V_{BE}$) of a transistor and the product of the thermodynamic voltage multiplied by a coefficient independent of temperature is adopted. The second reference voltage will then advantageously be chosen equal to an integer multiple of the first reference voltage (for example, three times the first reference voltage).

According to another embodiment of the present invention, the first generator includes a first current source that is connected to the supply voltage and generates a current independent of the supply voltage. The first voltage source includes a cell including a transistor whose collector is connected both to the base and to the output of the first current source, and an emitter resistor. The terminal of the emitter resistor which is not connected to the emitter of the transistor is connected to the first terminal of the capacitor, which will be short-circuited during the logical control mode. In one embodiment, the first generator includes a second current source which is connected to the supply voltage and generates a current independent of the supply voltage. The second voltage source then includes n cells (n being an integer greater than 1, for example equal to 3) connected in series between the output of the second current source and ground. Each cell is similar to the cell of the first voltage source.

The first and second current sources may advantageously be produced using a main current source which generates a current independent of the supply voltage, and two current mirrors. More precisely, the first current source includes the main current source which generates a current proportional to the ratio between the thermodynamic voltage and a bias resistor, and a first current mirror which is connected between the main current source and the transistor of the cell of the first voltage source. Similarly, the second current source includes the main current source and a second current mirror which is connected between the main current source and the transistor of the first cell of this second voltage source. This embodiment has the advantage of producing only a single current source that generates a current independent of the supply voltage, and using this main source to produce both of the current sources.

Furthermore, the device according to the present invention can include circuitry for charging the capacitor in order to generate the set-point signal when the processing circuit is in its first operating state. Moreover, the embodiment having the current sources described above has the advantage of allowing the first current source to also be used to charge the capacitor. In other words, this first current source is used in combination with the first voltage source to generate a first reference voltage independent of the supply voltage and to generate the set-point signal. Additionally, it is particularly advantageous for the emitter resistors of all of the cells of the two voltage sources, as well as the bias resistor, to be matched, along with the two resistors of each current mirror. This makes it possible to obtain reference voltages that are almost independent of any variations in temperature and process.

FIG. 1 shows a device DGP for generating a pulse signal having modulable width pulses according to a preferred embodiment of the present invention. The pulse or PWM signal is the output voltage $V_{PWM}$ of a comparator COMP2 that is supplied between the supply voltage $V_{Reg}$ and ground. In this exemplary embodiment, the output voltage $V_{PWM}$ controls two power NMOS transistors M2 and M4 of a bridge which has a conventional "H" structure and controls the value of the current flowing through a motor M (for example, a motor for winding the windows of a motor vehicle).

More precisely, the gate of power transistor M1 is connected to a voltage $V_{CP}$, which can be generated by a conventional charge-pump device so that the voltage $V_{CP}$ is higher than the voltage $V_{batt}$ delivered by the battery of the vehicle. With transistor M1 on, transistor M3 is off and transistors M2 and M4 are alternately and reciprocally on and off, according to the value of the output signal $V_{PWM}$. The duty cycle of the output signal $V_{PWM}$ is fixed by a control signal $V_C$ that is delivered to the non-inverting input of the comparator COMP2.

In addition to the comparator COMP2, the device DGP includes a first voltage source ST1 whose terminal $B_{OSC}$ is connected to a current source SI1 that is supplied by the supply voltage $V_{Reg}$. The other terminal $B_{CF}$ of the first voltage source ST1 is grounded through a MOS transistor N1 and also grounded via a capacitor CF. The device DGP also includes short-circuiting means for short-circuiting the capacitor CF, and therefore grounding terminal $B_{CF}$. In this embodiment, the short-circuiting means is illustratively a controllable switch ICF, which can also be produced using a gate turn-off transistor. In further embodiments, the circuit DGP is produced in the form of an integrated circuit that is fitted in a package, and one pin of the package is directly connected to terminal $B_{CF}$ so as to emerge outside the package. Depending on the control mode being used, this pin (which then forms the control means) may either be left free or tied to ground.

In other words, whether or not the capacitor CF is short-circuited depends on whether the logical or analog control mode is desired for the device. More precisely, if an analog control mode is desired (i.e., if the control signal $V_C$ is a continuous analog voltage), the device DGP has the configuration illustrated in FIG. 1 with the switch ICF open. However, if a logical control mode is desired (i.e., if the control signal $V_C$ is a two-state logical signal such as a conventional logical signal compatible with "transistor-transistor" or "TTL" logic), the switch ICF is closed and the terminal $B_{CF}$ is grounded. The device DGP then has the configuration illustrated in FIG. 3, which is discussed in more detail below.

The signal $V_C$ is generated by a second generating circuit with a conventional structure that is not shown here for simplicity. The gate of transistor N1 is connected, via delay means such as delay lines, to the output of another comparator COMP1 whose inverting input receives a second reference voltage $V_{Ref2}$. As described below, the second reference voltage $V_{Ref2}$ is chosen to be higher than the first reference voltage $V_{Ref1}$. Both terminal $B_{OSC}$ and the non-inverting input of comparator COMP1 are connected to the inverting input of comparator COMP2.

FIGS. 2a and 2b illustrate the operation of the device DGP illustrated in FIG. 1 in the configuration compatible with an analog control mode. The device DGP behaves as an oscillator that generates a sawtooth set-point signal $V_{OSC}$ at terminal $B_{OSC}$ (i.e., on the inverting input of comparator COMP1). More precisely, the current I1 delivered by the current source SI1 charges the capacitor CF to the second reference voltage $V_{Regf2}$. The capacitor CF is then discharged through the capacitor N1, so as to cause a decrease in voltage $V_{OSC}$ to the first reference voltage $V_{Ref1}$, which is less than the second reference voltage $V_{Ref2}$.

The control signal $V_C$, which is a DC voltage that can vary between 0 volts and the second reference voltage $V_{Ref2}$ (or may even be higher than the second reference voltage $V_{Ref2}$) is compared with voltage $V_{OSC}$ in comparator COMP2. The pulse signal $V_{PWM}$ then has the form illustrated in FIG. 2b with either a low level at 0 volts or a high level equal to the supply voltage $V_{Reg}$. More precisely, the pulse signal is at the high level when the set-point signal $V_{OSC}$ is less than the control signal $V_C$. It is at the low level when the set-point signal is higher than the control signal.

If $T_{ON}$ denotes the time for which the pulse signal is at the high level during one period T the set-point signal, and if $T_{OFF}$ denotes the remaining time in the period (i.e., the time for which the pulse signal is at the low level), the duty cycle DC is then given by formula (1).

$$DC = \frac{T_{ON}}{T_{ON} + T_{OFF}} = \frac{V_C}{V_{Ref2} - V_{Ref1}} \qquad (1)$$

Additionally, the period T of the set-point signal (i.e., the "sawtooth") is defined by formula (2).

$$T = CF \times \frac{V_{Ref2} - V_{Ref1}}{I1} \qquad (2)$$

If a logical control mode is now entered (i.e., with the switch ICF closed and terminal $B_{CF}$ consequently grounded), the oscillator is clearly off, and the configuration illustrated in a simplified way in FIG. 3 is then encountered. While in the analog control mode the first reference voltage $V_{Ref1}$ was a floating voltage taken between the two terminals $B_{OSC}$ and $B_{CF}$ and equal to the difference $V_{OSC}-V_{CF}$, this is no longer the case in the configuration of FIG. 3 since terminal $B_{CF}$ is grounded. Instead, the first reference voltage $V_{Ref1}$ is supplied to the inverting input of comparator COMP2, which furthermore receives the logical control signal $V_C$ at its non-inverting input.

Figure 4:
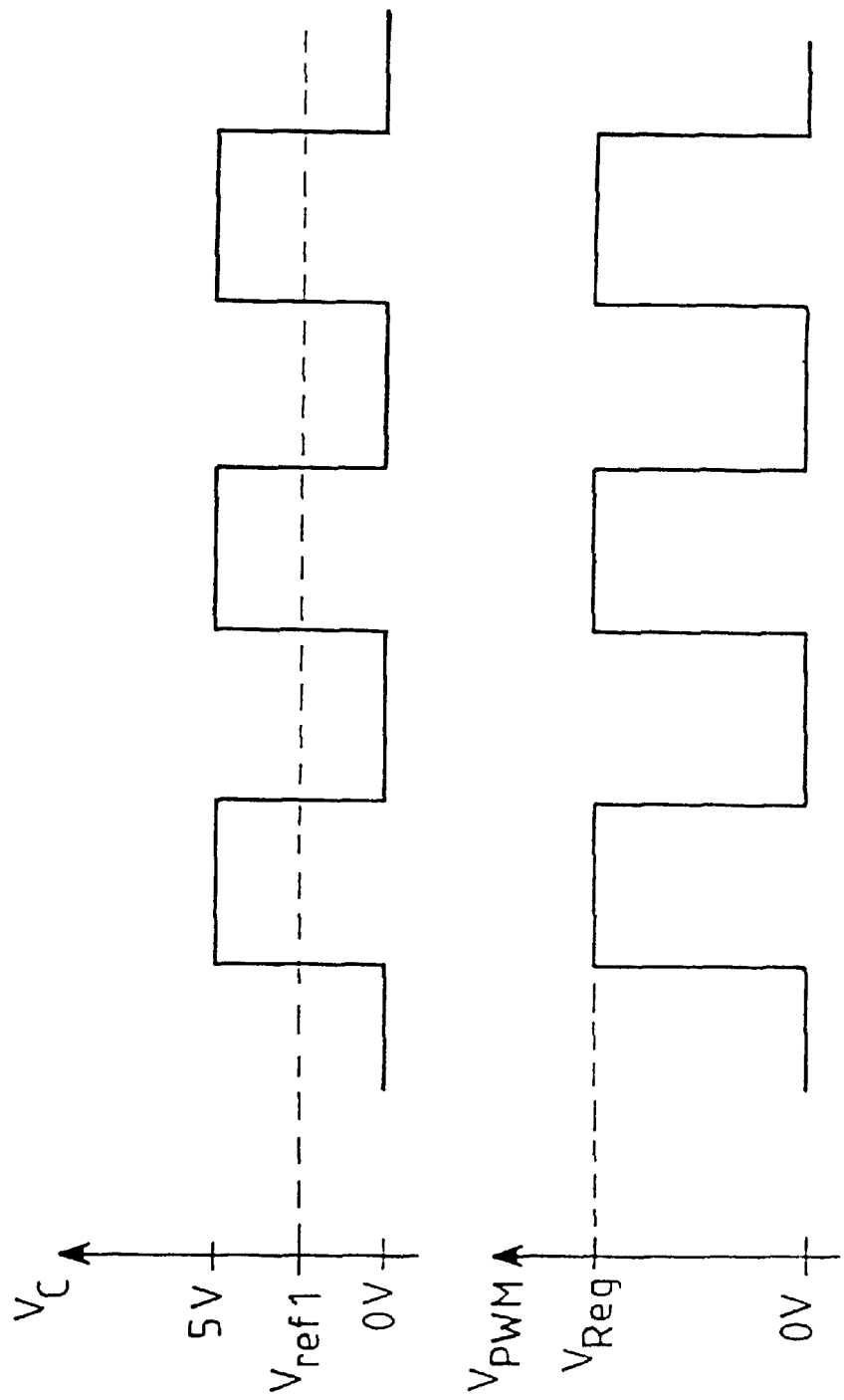
FIGS. 4a and 4b are timing diagrams illustrating the operation of the device of FIG. 3.

FIG. 4a represents a control signal whose low level lies at 0 volts and whose high level lies at 5 volts. Nevertheless, in practice, and in particular when a conventional TTL signal is involved, the logical level 0 may correspond to an amplitude of between 0 and 0.8 volts, and the logical level 1 may correspond to an amplitude of between 2 and 5 volts. In general, the difference between the level of the logical signal $V_C$ and the level of the first reference voltage $V_{Ref1}$ should be greater than the offset voltage of comparator COMP2. In FIG. 4a, the level of the first reference voltage $V_{Ref1}$ lies between the low level and the high level of the control signal, and may for example be equal to 1.23 volts (corresponding to a bandgap voltage reference independent of temperature, as explained in more detail below).

In a semiconductor integrated circuit, and generally in the bipolar type, the bandgap voltage reference is a voltage reference using the potential barrier of a PN junction, which corresponds to the width of the forbidden band of the semiconductor (i.e., about 1.3 volts for silicon). Furthermore, the offset voltages of the typical comparators are of the order of a few millivolts. Thus, in the present case, irrespective of the actual value of the high and low levels of the control signal, the difference between these levels and the first reference voltage $V_{Ref1}$ will always be greater than the offset voltage of the comparator.

Consequently, as illustrated in FIG. 4b, when the control signal is at a low level, the pulse signal is 0 volts, whereas when the control signal is at a high level, the level of the pulse signal is equal to the level of the supply voltage $V_{Reg}$. The duty cycle of the pulse signal is equal to the duty cycle of the control signal. Therefore, the circuit according to the present invention does not lead to any undefined states for the pulse signal, which was not the case for the conventional circuit in which the addition of a reference voltage $V_{Ref1}$ was not provided. In fact, in the conventional circuit, terminal $B_{CF}$ is grounded directly by grounding the inverting input of comparator COMP2, which leads to instabilities and therefore undefined states in the pulse signal when the two inputs of comparator COMP2 are at 0 volts.

The voltage sources that deliver the first reference voltage $V_{Ref1}$ and the second reference voltage $V_{Ref2}$ may be produced in a conventional manner. However, in certain applications, variations in the operating temperature of the circuit may be critical. Thus, at least for such applications, it is preferable for the difference between the two reference voltages to be independent of temperature so that when in an analog control mode, the duty cycle and period of the pulse signal are independent of temperature. Furthermore, in some applications such as automotive applications in which the voltage of the battery may fluctuate, it is also advantageous for the supply voltage $V_{Reg}$ to be a regulated voltage that produces a current I1 independent of the supply voltage (e.g., the battery voltage).

Figure 5:
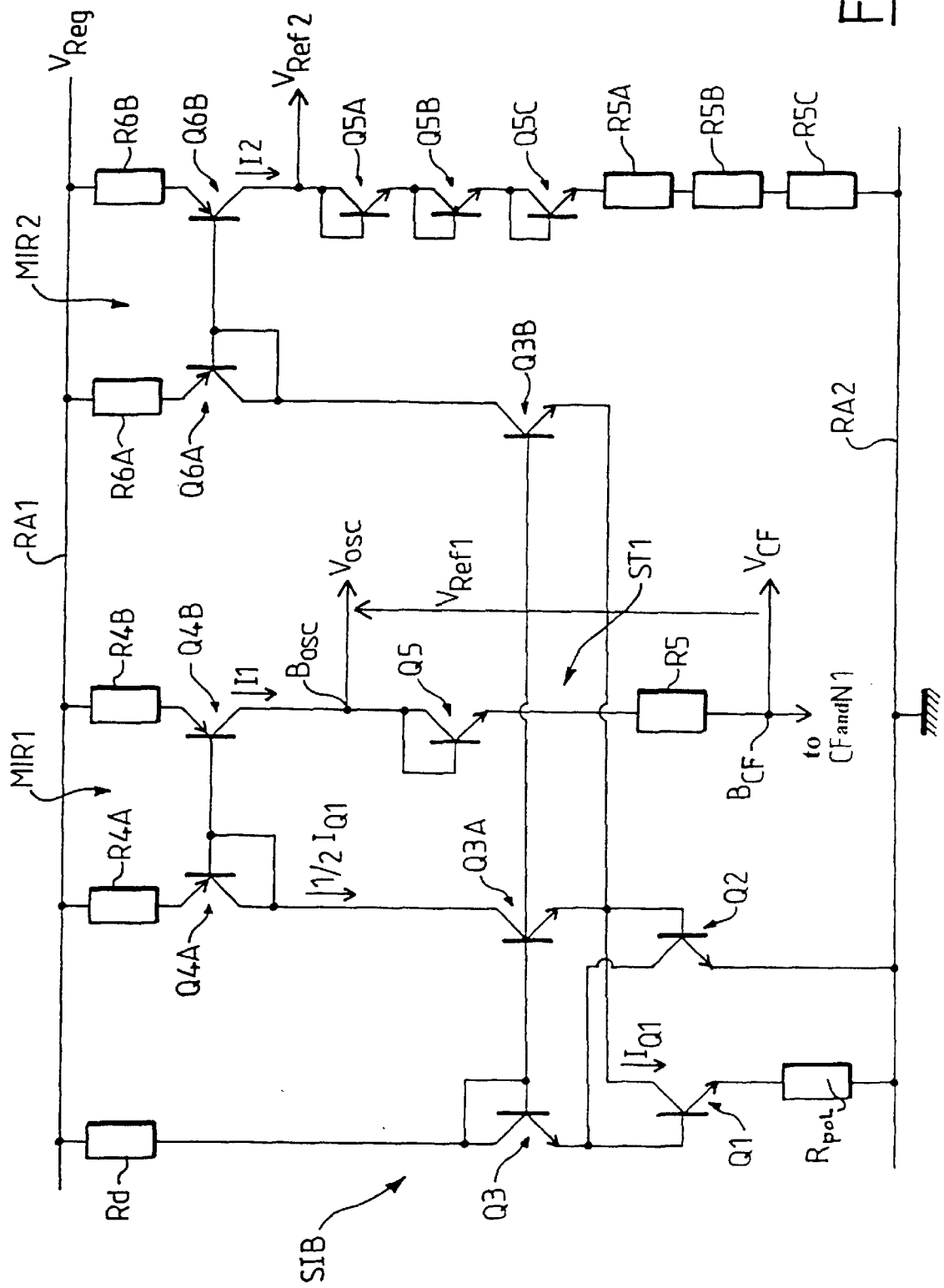
FIG. 5 is a schematic diagram illustrating in detail a portion of a device according to an exemplary embodiment of the present invention.

FIG. 5 illustrates an exemplary embodiment of a circuit for producing the various current and voltage sources with the characteristics described above. More precisely, the left-hand portion of FIG. 5 shows a "main" current source SIB that produces a current $I_{Q1}$ proportional to the ratio of the thermodynamic voltage Vt to a bias resistor $R_{pol}$, as will be described in more detail below. In particular, the thermodynamic voltage Vt is equal to KT/Q, where K denotes Boltzmann's constant, T denotes temperature, and Q denotes the charge on an electron. For example, this thermodynamic voltage is equal to 25.8 mvolts at 25° C.

The main current source SIB includes a collector resistor Rd that is connected between a line RA1 connected to the supply voltage $V_{Reg}$ and the collector of a transistor Q3. The collector of this transistor Q3 is also connected to its base, and the base is furthermore connected to the base of another transistor Q3A. The emitter of transistor Q3 is connected to the collector of a transistor Q2 whose emitter is connected to a RA2 that forms a ground plane. The base of transistor Q2 is connected to the emitter of transistor Q3A and to the emitter of transistor Q3B. The emitter of transistor Q3 is also connected to the base of a transistor Q1 whose collector is connected to the emitter of transistor Q3A and to the emitter of transistor Q3B, and whose emitter is connected to line RA2 via the bias resistor $R_{pol}$.

Ignoring the base currents, the current $I_{Q1}$ is then given by formula (3).

$$I_{Q1} = \frac{Vt}{R_{pol}} \cdot Ln\left[\frac{SQ3 \cdot SQ1}{2SQ3 \cdot SQ2} \cdot \frac{1}{(1 + V_{CEQ3AB}/VAFN)}\right] \quad (3)$$

where $V_{CEQ3AB}$ denotes the difference in collector-emitter voltage of transistors Q3A and Q3B, SQ1, SQ2, and SQ3 respectively denote the emitter areas of the transistors Q1, Q2, and Q3, VAFN denotes the Early voltage of an NPN transistor, and Ln denotes the natural logarithm function. In this formula, because of the symmetry of the circuit diagram, it has also been assumed that the differences in collector-emitter voltage are the same for transistors Q3A and Q3B ($V_{CEQ3AB}=V_{CEQ3A}=V_{CEQ3B}$), and that the emitter areas of transistors Q3A, Q3B, and Q3 are the same.

If a regulating voltage on the order of 5 volts is chosen, the term $V_{CEQ3AB}$, which is equal to the difference $V_{Reg}-2V_{BE}$, will then be about 3.6 volts ($V_{BE}$: base-emitter voltage approximately equal to 0.7 volts). Furthermore, the Early voltage is typically equal to 175 volts. Consequently, the term A is on the order of 1 as shown by formula (4).

$$A = \frac{1}{1 + V_{CEQ3AB}/VAFN} \quad (4)$$

Consequently, since the main current source SIB is supplied with a regulating voltage that is assumed to be constant, the current $I_{Q1}$ is independent of this regulating voltage and also of the battery supply voltage. The current $I_{Q1}$ is therefore proportional to the ratio $Vt/R_{pol}$.

Besides this main current source SIB, the circuit illustrated in FIG. 5 also includes a first current mirror MIR1 formed by two transistors Q4A and Q4B, and two emitter resistors R4A and R4B. This current mirror MIR1 forms the first current source SI1 that delivers the current I1. This current I1 is then given by formula (5).

$$I1 = 1/2 I_{Q1}\left[\frac{R4A}{R4B}\right] \quad (5)$$

Therefore, the current I1 is also independent of voltage $V_{Reg}$.

The first voltage source ST1 is formed in this exemplary embodiment by a transistor Q5 whose collector and base are connected together and to the collector of transistor Q4B of the current mirror MIR1, with this common node forming terminal $B_{OSC}$. The voltage source ST1 also includes an emitter resistor R5 connected in series between the emitter of transistor Q5 and the capacitor CF and the drain of transistor N1 (terminal $B_{CF}$ in FIG. 1). Thus, the first reference voltage $V_{Ref1}$ generated is independent of temperature. In fact, the first reference voltage $V_{Ref1}$ is defined by formula (6).

$$V_{Ref1}=V_{BEQ5}+R5I1 \quad (6)$$

In view of formulae (3) and (5), the first reference voltage $V_{Ref1}$ is defined by formula (7).

$$V_{Ref1} = V_{BEQ5} + \frac{R5}{R_{pol}} K1 Vt \quad (7)$$

where K1 is a coefficient defined by formula (8).

$$K1 = 1/2 \frac{R4A}{R4B} Ln\left[\frac{SQ3 \cdot SQ1}{2SQ3 \cdot SQ2} \cdot A\right] \quad (8)$$

where A is defined by formula (4).

Since resistors R4A and R4B are matched resistors (i.e., resistors that are of the same type produced side by side with the same characteristics), the ratio R4A/R4B is independent of the operating temperature and is also independent of the characteristics of the fabrication process. The result is that the coefficient K1 is independent of the temperature and the fabrication process. If the choice is also made to match resistors R5 and $R_{pol}$, the reference voltage $V_{Ref1}$ is then defined by formula (9).

$$V_{Ref1}=V_{BEQ5}+K2Vt \quad (9)$$

where K2 is a constant independent of the temperature and the fabrication process.

Furthermore, the base-emitter voltage difference of a transistor and the thermodynamic voltage Vt vary in opposite ways as a function of temperature and according to different laws that are well known. Consequently, one of ordinary skill in the art can appropriately adjust the value of the coefficient K2 so as to obtain a zero variation in the first reference voltage $V_{Ref1}$ as a function of temperature. More particularly, K2 may be chosen so as to obtain a first reference voltage $V_{Ref1}$ that is equal to 1.23 volts at 25° C., which corresponds to a bandgap reference voltage independent of temperature.

Additionally, the circuit illustrated in FIG. 5 includes a second current mirror MIR2, which has a similar structure to the first current mirror MIR1 and is connected via a transistor Q3B to the main current source SIB. This second current mirror, which is also connected to voltage $V_{Reg}$, behaves as a second current source that delivers a current I2 defined by formula (10).

$$I2 = 1/2I_{Q1}\left[\frac{R6A}{R6B}\right] \qquad (10)$$

In a similar way to that described above, the current I2 is also independent of voltage $V_{Reg}$.

Furthermore, in the exemplary embodiment of FIG. 5, the cell (Q5, R5) that forms the first voltage source ST1 is duplicated three times on the right-hand portion of FIG. 5. The three cells (Q5A, R5A), (Q5B, R5B), and (Q5C, R5C) are connected in series between the collector of transistor Q6B of the second current mirror MIR2 and ground. These three cells form a second voltage source that delivers the second reference voltage $V_{Ref2}$. This second reference voltage is equal to three times the first reference voltage. Therefore, in the present case, it is equal to about 3.69 volts ($V_{Ref1}$=1.23 volts).

In a manner similar to that described above, this second reference voltage is also independent of the temperature and the characteristics of the fabrication process, so long as resistors R6A and R6B are matched. Since the two reference voltages $V_{Ref1}$ and $V_{Ref2}$ are independent of the temperature and the fabrication process, the duty cycle of the period of the pulse signal is consequently independent of the temperature and the fabrication process. Furthermore, in the embodiment described above, it is noteworthy that the first current mirror MIR1 also has the function of charging the capacitor CF using current I1, in order to generate the sawtooth set-point signal during an analog control mode.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for generating a pulse signal with modulable-width pulses, said method comprising the steps of:
   generating a set-point signal;
   comparing the set-point signal with a control signal so as to produce the pulse signal,
   wherein when the control signal is a two-state logical signal, a first reference voltage is taken as the set-point signal, and
   when the control signal is a continuous analog voltage, the set-point signal is varied between the first reference voltage and a predetermined second reference voltage, which is higher than the first reference voltage.

2. The method as defined in claim 1, wherein the difference in level between the first reference voltage and the logical signal is greater than the offset voltage of a comparator that performs the comparing step.

3. The method as defined in claim 1, further comprising the step of generating the first reference voltage in floating mode by connecting a voltage source between a first input of a comparator that performs the comparing step and a grounded capacitor, when the control signal is a continuous analog voltage.

4. The method as defined in claim 3, further comprising the step of grounding a terminal of the first voltage source that is connected to the capacitor, when the control signal is a two-state logical signal.

5. A device for generating a pulse signal with modulable-width pulses, said device comprising:
   a set-point signal generator for generating a set-point signal;
   a control signal generator for generating a control signal; and
   a comparator having a first input that receives the set-point signal and a second input that receives the control signal, the comparator outputting the pulse signal,
   wherein the set-point signal generator includes:
   a first voltage source for generating a first reference voltage;
   a second voltage source for generating a second reference voltage, which is higher than the first reference voltage;
   wherein in a first operating state, the generated set-point signal varies between the two reference voltages, and
   in a second operating state, the first reference voltage is supplied as the set-point signal,
   the control signal generator can generate both a continuous analog voltage and a two-state logical signal, and
   the set-point signal generator is operated in the first operating state when the control signal generator generates the continuous analog voltage as the control signal, and in the second operating state when the control signal generator generates the logical signal as the control signal.

6. The device as defined in claim 5, wherein the difference in level between the first reference voltage and the logical signal is greater than the offset voltage of the comparator.

7. The device as defined in claim 5, further comprising:
   a capacitor having a first terminal and a second terminal that is coupled to ground, the first voltage source being coupled between the first input of the comparator and the first terminal of the capacitor; and
   short-circuit means for selectively grounding the first terminal of the capacitor.

8. The device as defined in claim 5, wherein both the first reference voltage and the second reference voltage are independent of temperature.

9. The device as defined in claim 8,
   wherein the first reference voltage is equal to the sum of an emitter-collector voltage difference of a transistor and the product of the thermodynamic voltage multiplied by a coefficient independent of temperature, and
   the second reference voltage is an integer multiple of the first reference voltage.

10. The device as defined in claim 5,
wherein the set-point signal generator further includes a first current source that is coupled to the supply voltage, the first current source generating a current that is independent of the supply voltage, and
the first voltage source includes a cell having a transistor whose collector is connected to its base and coupled to the first current source, and an emitter resistor having a first terminal that is coupled to the emitter of the transistor.

11. The device as defined in claim 10, wherein a second terminal of the emitter resistor is connected to the first terminal of the capacitor.

12. The device as defined in claim 10,
wherein the set-point signal generator further includes a second current source that is coupled to the supply voltage, the second current source generating a current that is independent of the supply voltage, and
the second voltage source includes n cells connected in series between the second current source and ground, each of the cells of the second voltage source having the same components as the cell of the first voltage source.

13. The device as defined in claim 12,
wherein the first current source includes a main current source for generating a current proportional to the ratio between the thermodynamic voltage and a bias resistor, and a first current mirror that is coupled between the main current source and the transistor of the cell of the first voltage source, and
the second current source includes the main current source and a second current mirror that is coupled between the main current source and the transistor of the first cell of the second voltage source.

14. The device as defined in claim 13,
wherein the emitter resistors of all of the cells and the bias resistor are matched,
the two resistors of each current mirror are matched, and
the first current source is capable of charging the capacitor in order to generate the set-point signal when the set-point signal generator is operated in the first operating state.

15. An apparatus including a load, at least one power transistor that controls current flowing through the load, and a device for generating a pulse signal that drives the power transistor, the pulse signal having modulable-width pulses, said device comprising:
a set-point signal generator for generating a set-point signal;
a control signal generator for generating a control signal; and
a comparator having a first input that receives the set-point signal and a second input that receives the control signal, the comparator outputting the pulse signal,
wherein the set-point signal generator includes:
a first voltage source for generating a first reference voltage;
a second voltage source for generating a second reference voltage, which is higher than the first reference voltage;
wherein in a first operating state, the generated set-point signal varies between the two reference voltages, and
in a second operating state, the first reference voltage is supplied as the set-point signal,
the control signal generator can generate both a continuous analog voltage and a two-state logical signal, and
the set-point signal generator is operated in the first operating state when the control signal generator generates the continuous analog voltage as the control signal, and in the second operating state when the control signal generator generates the logical signal as the control signal.

16. The apparatus as defined in claim 15, wherein the difference in level between the first reference voltage and the logical signal is greater than the offset voltage of the comparator.

17. The apparatus as defined in claim 15, wherein said device further comprises:
a capacitor having a first terminal and a second terminal that is coupled to ground, the first voltage source being coupled between the first input of the comparator and the first terminal of the capacitor; and
short-circuit means for selectively grounding the first terminal of the capacitor.

18. The apparatus as defined in claim 15, wherein both the first reference voltage and the second reference voltage are independent of temperature.

19. The apparatus as defined in claim 18,
wherein the first reference voltage is equal to the sum of an emitter-collector voltage difference of a transistor and the product of the thermodynamic voltage multiplied by a coefficient independent of temperature, and
the second reference voltage is an integer multiple of the first reference voltage.

20. The apparatus as defined in claim 15,
wherein the set-point signal generator further includes a first current source that is coupled to the supply voltage, the first current source generating a current that is independent of the supply voltage, and
the first voltage source includes a cell having a transistor whose collector is connected to its base and coupled to the first current source, and an emitter resistor having a first terminal that is coupled to the emitter of the transistor.

21. The apparatus as defined in claim 20,
wherein the set-point signal generator further includes a second current source that is coupled to the supply voltage, the second current source generating a current that is independent of the supply voltage, and
the second voltage source includes n cells connected in series between the second current source and ground, each of the cells of the second voltage source having the same components as the cell of the first voltage source.

22. The apparatus as defined in claim 21,
wherein the first current source includes a main current source for generating a current proportional to the ratio between the thermodynamic voltage and a bias resistor, and a first current mirror that is coupled between the main current source and the transistor of the cell of the first voltage source,
the second current source includes the main current source and a second current mirror that is coupled between the main current source and the transistor of the first cell of the second voltage source,
the emitter resistors of all of the cells and the bias resistor are matched,
the two resistors of each current mirror are matched, and
the first current source is capable of charging the capacitor in order to generate the set-point signal when the set-point signal generator is operated in the first operating state.

* * * * *